United States Patent
Kitamura et al.

(10) Patent No.: US 9,111,833 B2
(45) Date of Patent: Aug. 18, 2015

(54) METHOD OF MANUFACTURING SOLID-STATE IMAGING DEVICE AND SOLID-STATE IMAGING DEVICE

(71) Applicant: Kabushiki Kaisha Toshiba, Tokyo (JP)

(72) Inventors: Yosuke Kitamura, Oita (JP); Hisashi Aikawa, Oita (JP); Kazunori Kakehi, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 206 days.

(21) Appl. No.: 13/867,241

(22) Filed: Apr. 22, 2013

(65) Prior Publication Data

US 2014/0110809 A1    Apr. 24, 2014

(30) Foreign Application Priority Data

Oct. 23, 2012 (JP) .................. 2012-233853

(51) Int. Cl.
*H01L 27/146* (2006.01)

(52) U.S. Cl.
CPC ...... *H01L 27/1464* (2013.01); *H01L 27/14623* (2013.01); *H01L 27/14645* (2013.01); *H01L 27/14689* (2013.01)

(58) Field of Classification Search
CPC .............. H01L 27/1464; H01L 27/14645; H01L 27/14689; H01L 27/14623
See application file for complete search history.

(56) References Cited

U.S. PATENT DOCUMENTS

| | | | |
|---|---|---|---|
| 7,084,443 B2 | 8/2006 | Kitano et al. | |
| 7,205,623 B2 | 4/2007 | Hong et al. | |
| 7,262,396 B2 | 8/2007 | Inoue et al. | |
| 7,355,158 B2 | 4/2008 | Inoue et al. | |
| 7,382,007 B2 | 6/2008 | Kitano et al. | |
| 7,482,570 B2 | 1/2009 | Inoue et al. | |
| 7,595,214 B2 | 9/2009 | Kitano et al. | |
| 7,767,485 B2 | 8/2010 | Ogawa et al. | |
| 2010/0006969 A1* | 1/2010 | Park et al. | 257/446 |
| 2012/0025059 A1 | 2/2012 | Kawashima et al. | |
| 2012/0217602 A1* | 8/2012 | Enomoto | 257/432 |

FOREIGN PATENT DOCUMENTS

| | | |
|---|---|---|
| JP | 3-272177 | 12/1991 |
| JP | 4-155966 | 5/1992 |
| JP | 3067264 | 5/2000 |

(Continued)

OTHER PUBLICATIONS

Office Action issued Mar. 20, 2014 in Korean Patent Application No. 10-2013-60156 (with English translation).

*Primary Examiner* — Ermias Woldegeorgis

(74) *Attorney, Agent, or Firm* — Oblon, McClelland, Maier & Neustadt, L.L.P.

(57) ABSTRACT

According to one embodiment, a method of manufacturing a solid-state imaging device includes a trench forming process, a concave portion forming process, a coating process, and a burying process. In the trench forming process, a trench is formed at the position to isolate a plurality of photoelectric conversion elements. In the concave portion forming process, a concave portion is formed at the position to form a light shielding film of shielding at least part of subject light incident on an adjustment photoelectric conversion element used for an image quality adjustment of an imaged image. In the coating process, inner circumferential surfaces of the trench and the concave portion are coated with an insulating film. In the burying process, a light shielding member is buried inside the trench and the concave portion whose inner circumferential surface are coated with the insulating film.

8 Claims, 7 Drawing Sheets

(56) References Cited

FOREIGN PATENT DOCUMENTS

| | | |
|---|---|---|
| JP | 2003-142674 | 5/2003 |
| JP | 2004-319959 | 11/2004 |
| JP | 2006-93687 | 4/2006 |
| JP | 2010-40621 | 2/2010 |
| JP | 2010-62437 | 3/2010 |
| JP | 2011-3860 | 1/2011 |
| JP | 2012-33583 | 2/2012 |
| JP | 2012-178457 | 9/2012 |

* cited by examiner

METHOD OF MANUFACTURING SOLID-STATE IMAGING DEVICE AND SOLID-STATE IMAGING DEVICE

CROSS-REFERENCE TO RELATED APPLICATIONS

This application is based upon and claims the benefit of priority from Japanese Patent Application No. 2012-233853, filed on Oct. 23, 2012; the entire contents of which are incorporated herein by reference.

FIELD

Embodiments described herein relate generally to a method of manufacturing a solid-state imaging device and a solid-state imaging device.

BACKGROUND

In the past, there have been known solid-state imaging devices that are provided with a plurality of photoelectric conversion elements including an imaging photoelectric conversion element used for imaging an image and an adjustment photoelectric conversion element used for an image quality adjustment of an imaged image.

In the solid-state imaging device, a deep trench isolation (DTI) or a shallow trench isolation (STI) is formed between the photoelectric conversion elements, and the photoelectric conversion elements are isolated from each other by the DTI or the STI. Further, a light shielding film that shields all or a part of incident subject light is disposed on the side of the adjustment photoelectric conversion element to which subject light is incident.

Here, a photoelectric conversion element having a light shielding film that shields all of subject light is called an optical black, and used to determine a reference of black in an imaged image. Further, a photoelectric conversion element having a light shielding film that shields a part of subject light is used for a focus adjustment by a phase difference detection scheme.

An element isolation region of isolating the photoelectric conversion elements from each other such as the DTI or the STI and the light shielding film that shields all or a part of the subject light are generally formed by individual manufacturing processes and have a problem in that the manufacturing processes are complicated.

DETAILED DESCRIPTION

In general, according to one embodiment, a method of manufacturing a solid-state imaging device includes a trench forming process, a concave portion forming process, a coating process, and a burying process. In the trench forming process, a trench is formed at the position to isolate a plurality of photoelectric conversion elements including an imaging photoelectric conversion element used for imaging of an image and an adjustment photoelectric conversion element used for an image quality adjustment of an imaged image. In the concave portion forming process, a concave portion is formed at the position to form a light shielding film of shielding at least part of subject light incident on the adjustment photoelectric conversion element. In the coating process, the inner circumferential surfaces of the trench and the concave portion are coated with an insulating film. In the burying process, a light shielding member is buried inside the trench and the concave portion whose inner circumferential surface are coated with the insulating film.

Exemplary embodiments of a solid-state imaging device and a method of manufacturing a solid-state imaging device will be explained below in detail with reference to the accompanying drawings. The present invention is not limited to the following embodiments.

In the present embodiment, the description will proceed using a back-illuminated complementary metal oxide semiconductor (CMOS) image sensor in which an interconnection layer is formed on a surface side opposite to a subject light incident surface of a photoelectric conversion element that performs photoelectric conversion on incident subject light as an example of a solid-state imaging device.

However, the solid-state imaging device according to the present embodiment is not limited to the back-illuminated CMOS image sensor and may be any image sensor such as a front-illuminated CMOS image sensor or a charge coupled device (CCD) image sensor.

Figure 1:
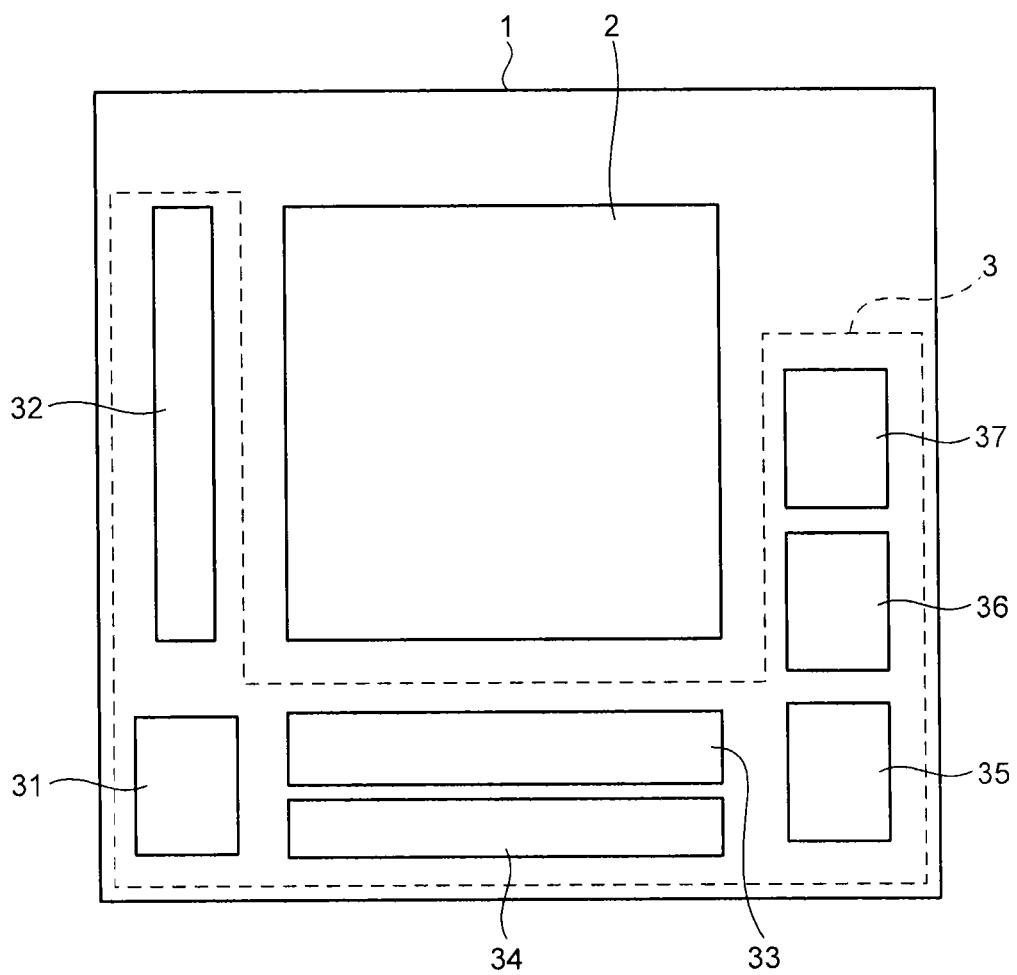
FIG. 1 is an explanatory top view illustrating a CMOS sensor according to an embodiment.

FIG. 1 is an explanatory top view illustrating a back-illuminated CMOS image sensor (hereinafter, referred to as a "CMOS sensor 1") according to an embodiment. As illustrated in FIG. 1, the CMOS sensor 1 includes a pixel unit 2 and a logic unit 3.

The pixel unit 2 includes a plurality of photoelectric conversion elements that are disposed in the form of a matrix when viewed from the top. Each photoelectric conversion element performs photoelectric conversion from incident subject light into the amount of charges according to the amount of received light (intensity of received light), and accumulates the charges in a charge accumulation region.

The plurality of photoelectric conversion elements include an imaging photoelectric conversion element used for imaging of an image and an adjustment photoelectric conversion element used for an image quality adjustment of an imaged image. A configuration of the photoelectric conversion element will be described later with reference to FIGS. 2A and 2B.

The logic unit 3 includes a timing generator 31, a vertical selecting circuit 32, a sampling circuit 33, a horizontal selecting circuit 34, a gain control circuit 35, an analog/digital (A/D) converting circuit 36, an amplifying circuit 37, and the like.

The timing generator 31 is a processing unit that outputs a pulse signal used as a reference of an operation timing on the pixel unit 2, the vertical selecting circuit 32, the sampling circuit 33, the horizontal selecting circuit 34, the gain control circuit 35, the A/D converting circuit 36, the amplifying circuit 37, and the like.

The vertical selecting circuit 32 is a processing unit that sequentially selects a photoelectric conversion element that reads charges out of a plurality of photoelectric conversion elements arranged in the form of a matrix in units of rows. The vertical selecting circuit 32 outputs charges accumulated in the photoelectric conversion elements selected in units of rows from the photoelectric conversion elements to the sampling circuit 33 as a pixel signal representing brightness of each pixel.

The sampling circuit 33 is a processing unit that removes noise from the pixel signal input from each photoelectric conversion element selected in units of rows by the vertical selecting circuit 32 through correlated double sampling (CDS) and temporarily holds the sampled pixel signal.

The horizontal selecting circuit 34 is a processing unit that sequentially selects and reads the pixel signals held in the sampling circuit 33 in units of columns and outputs the pixel signals to the gain control circuit 35. The gain control circuit 35 is a processing unit that adjusts a gain of the pixel signal input from the horizontal selecting circuit 34 and outputs the pixel signal with the adjusted gain to the A/D converting circuit 36.

The A/D converting circuit 36 is a processing unit that converts the analog pixel signal input from the gain control circuit 35 into a digital pixel signal, and outputs the digital pixel signal to the amplifying circuit 37. The amplifying circuit 37 is a processing unit that amplifies the digital pixel signal input from the A/D converting circuit 36 and outputs the amplified digital pixel signal to a predetermined digital signal processor (DSP) (not illustrated).

As described above, the CMOS sensor 1 performs imaging such that a plurality of photoelectric conversion elements arranged in the pixel unit 2 perform photoelectric conversion from incident subject light to the amount of charges corresponding to the amount of received light and accumulate the charges, and the logic unit 3 reads the charges accumulated in the photoelectric conversion elements as the pixel signals.

Figure 2A:
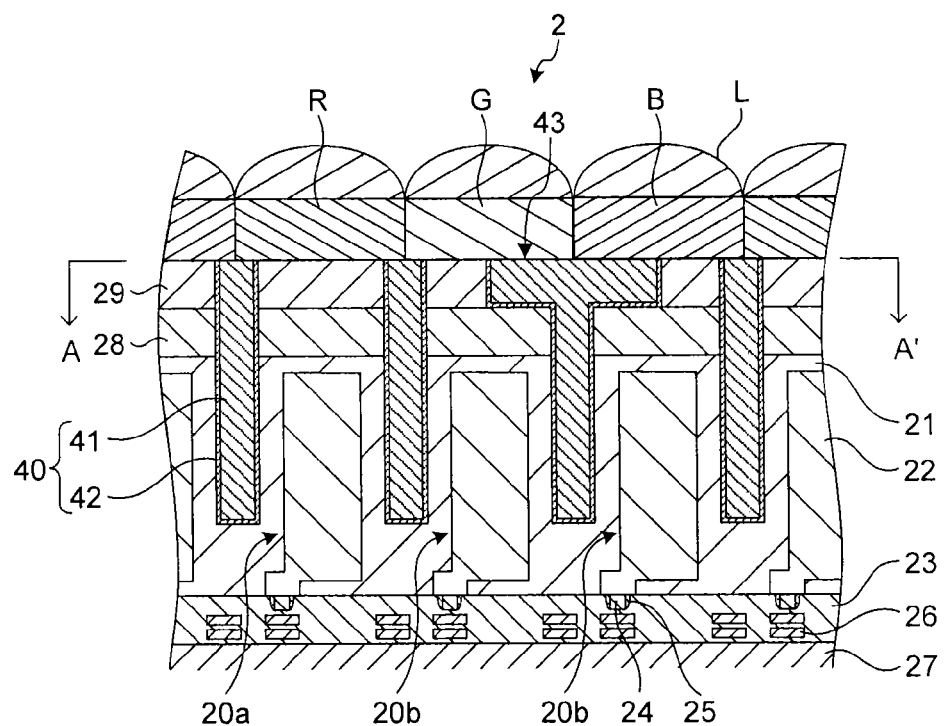
FIGS. 2A and 2B are explanatory views for describing a part of a pixel unit according to an embodiment.
Figure 2B:
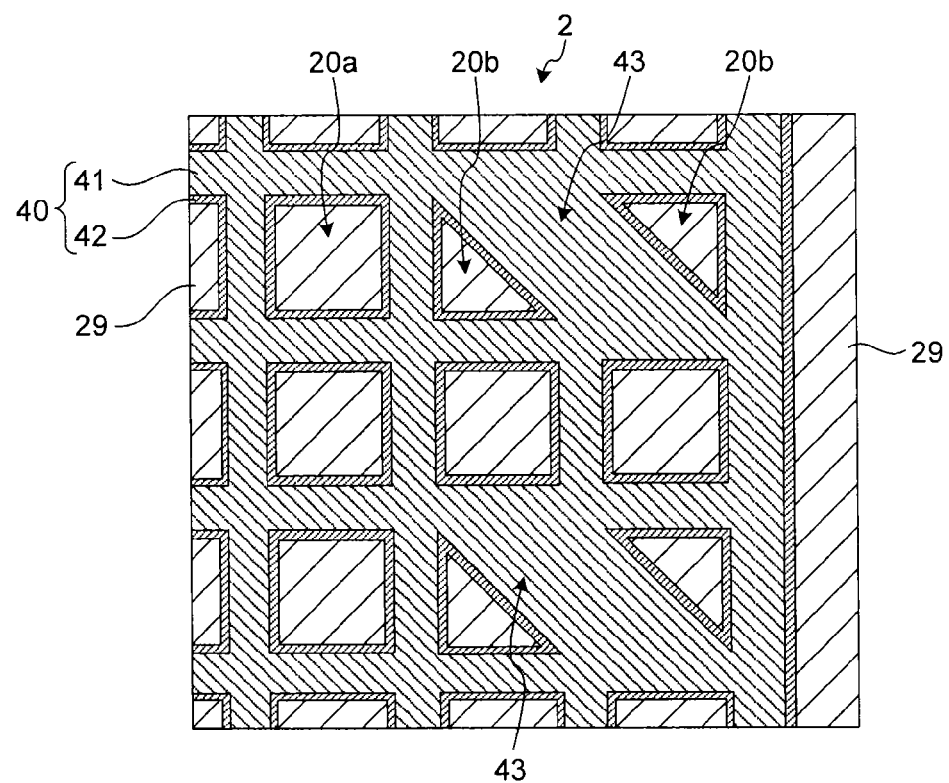

Next, a configuration of the pixel unit 2 according to an embodiment will be described with reference to FIGS. 2A and 2B. FIGS. 2A and 2B are explanatory views illustrating a part of the pixel unit 2 according to an embodiment. FIG. 2A schematically illustrates a cross section of a part of the pixel unit 2 according to an embodiment, and FIG. 2B illustrates a schematic cross section of the pixel unit 2 taken along line A-A' in FIG. 2A.

As illustrated in FIG. 2A, for example, the pixel unit 2 is disposed on a support substrate 27 such as a Si (silicon) wafer. The pixel unit 2 includes a plurality of photoelectric conversion elements 20a and 20b each of which performs photoelectric conversion from incident subject light into charges according to the amount of received light and then accumulates the charges.

For example, each of the photoelectric conversion elements 20a and 20b includes a photodiode that is formed by a PN junction between a P-type Si (silicon) region 21 into which a P-type impurity such as boron (B) is doped and an N-type Si region 22 into which an N-type impurity such as phosphorous (P) is doped.

Here, the photoelectric conversion element 20a is a photoelectric conversion element used for imaging of an image. A SiN (silicon nitride) film 28 serving an anti-reflection film is formed on the subject light incident side surface (here, the top surface) of the photoelectric conversion element 20a, and a tetraethoxysilane (TEOS) oxide film 29 is formed on the top surface of the SiN film 28.

Meanwhile, the photoelectric conversion element 20b is a photoelectric conversion element used for an image quality adjustment of an imaged image, and, for example, used for a focus adjustment of an imaging lens (not illustrated) by a phase difference detection scheme. The SiN film 28 serving as the anti-reflection film is formed on the subject light incident side surface of the photoelectric conversion element 20b (here, the top surface).

Then, a light shielding film 43 formed by a light shielding member 41 whose peripheral surface is coated with an insulating film 42 is formed, on the top surface of the SiN film 28, at the position at which at least part of subject light incident to the photoelectric conversion element 20b is shielded.

The light shielding film 43 is formed to cover diagonal half of the light receiving surface in the photoelectric conversion element 20b as illustrated in FIG. 2B. Further, the TEOS oxide film 29 is formed, on the top surface of the SiN film 28, at the position at which the light shielding film 43 is not formed.

Here, as illustrated in FIG. 2B, the pixel unit 2 is provided with the adjustment photoelectric conversion element 20b in which one diagonal half of the light receiving surface is light-shielded and the adjustment photoelectric conversion element 20b in which the other diagonal half of the light receiving surface is light-shielded. As a result, pieces of subject light that differ in phase are incident to the photoelectric conversion element 20b in which one diagonal half is light-shielded and the photoelectric conversion element 20b in which the other diagonal half is light-shielded in different oblique directions.

As described above, in the pixel unit 2, the subject light is pupil-divided by causing the photoelectric conversion element 20b in which one diagonal half is light-shielded and the photoelectric conversion element 20b in which the other diagonal half is light-shielded to receive subject light incident in oblique directions of different angles. Further, in the CMOS sensor 1, a pair of images are formed using the pupil-divided subject light, and control of adjusting defocusing of an imaging lens (not illustrated) is performed based on an interval between a pair of formed images.

In addition, any one of color filters R, G, and B is formed on each of the TEOS oxide film 29 and the light shielding film 43 at the position facing the photoelectric conversion elements 20a and 20b, and a microlens L is formed on the top surface of each of the color filters R, G, and B. The color filter R selectively allows red incident light to pass through, the color filter G selectively allows green incident light to pass through, and the color filter B selectively allows blue incident light to pass through. The microlens L is a plane-convex lens that condenses incident subject light on the corresponding photoelectric conversion elements 20a and 20b.

The N-type Si regions 22 in the plurality of photoelectric conversion elements 20a and 20b are charge accumulation regions that accumulate charges that have been subjected to photoelectric conversion, and are arranged in the P-type Si region 21 in the form of a matrix when viewed from the top. The photoelectric conversion elements 20a and 20b are electrically and optically isolated from each other through an element isolation region 40.

The element isolation region 40 is the light shielding member 41 whose peripheral surface is coated with the insulating film 42, and the element isolation regions 40 are arranged to surround the photoelectric conversion elements 20a and 20b in the form of a lattice when viewed from the top as illustrated in FIG. 2B. Through the element isolation region 40, the photoelectric conversion elements 20a and 20b can be electrically isolated from each other through the insulating film 42 coating the peripheral surface of the light shielding member 41, and the photoelectric conversion elements 20a and 20b can be optically isolated from each other through the light shielding member 41.

Here, the element isolation region 40 and the light shielding film 43 are simultaneously formed by dual-damascene. For this reason, there is no boundary between the element isolation region 40 that isolates the neighboring adjustment photoelectric conversion elements 20b from each other and the light shielding member 41 in the light shielding film 43, and the peripheral surface of the light shielding member 41 is coated with the unbroken insulating film 42.

As described above, the element isolation region 40 and the light shielding film 43 according to an embodiment can be simultaneously formed by dual-damascene, and thus the manufacturing process of forming the element isolation region 40 and the light shielding film 43 can be simplified. The manufacturing process of simultaneously forming the element isolation region 40 and the light shielding film 43 by dual-damascene will be described later with reference to FIGS. 3A to 6C.

In addition, the pixel unit 2 includes a read gate 24 for reading charges out of each N-type Si region 22, and the read gate 24 is formed on the surface (here, the bottom surface) opposite to the subject light incident side surface (herein the top surface) of the photoelectric conversion elements 20a and 20b. A sidewall 25 is formed on the peripheral surface of each read gate 24. The read gate 24 and the sidewall 25 are buried in an interlayer insulating film 23.

In addition to the read gate 24, a multi-layer interconnection 26 and the like are buried in the interlayer insulating film 23. For example, the multi-layer interconnection 26 is used to read out the charges that have been subjected to photoelectric conversion or to transfer a driving signal to other circuit elements (not illustrated) included in the CMOS sensor 1.

Next, a method of manufacturing the CMOS sensor 1 according to an embodiment will be described with reference to FIGS. 3A to 6C. A method of manufacturing the logic unit 3 in the CMOS sensor 1 is the same as in a general CMOS sensor according to a related art. For this reason, a method of manufacturing the pixel unit 2 in the CMOS sensor 1 will be described below, and a description of a method of manufacturing the logic unit 3 will not be made.

FIGS. 3A to 6C are explanatory cross-sectional views illustrating a manufacturing process of the CMOS sensor 1 according to an embodiment. FIGS. 3A to 6C schematically illustrate a process of manufacturing a portion corresponding to three pixels in the pixel unit 2.

Figure 3A:
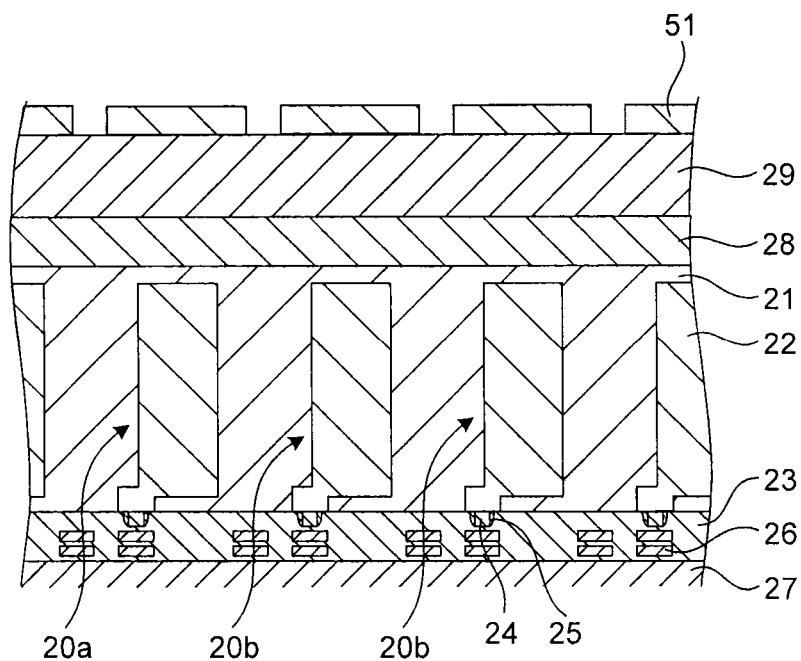
FIGS. 3A and 3B are explanatory cross-sectional views illustrating a manufacturing process of a CMOS sensor according to an embodiment.

In order to manufacture the CMOS sensor 1, first, a structure illustrated in FIG. 3A is formed. Specifically, for example, prepared is a semiconductor substrate such as a Si wafer having the P-type Si region 21 into which a P-type impurity such as boron (B) is doped.

Then, for example, an N-type impurity such as phosphorus (P) is doped into a predetermined position in the P-type Si region 21, so that a plurality of N-type Si regions 22 are formed. At this time, the plurality of N-type Si regions 22 are formed in the form of a matrix when viewed from the top to respectively correspond to pixels of an imaged image.

As a result, formed are a plurality of photoelectric conversion elements 20a and 20b each of which is a photodiode formed by a PN junction between the P-type Si region 21 and the N-type Si region 22. The N-type Si region 22 serves as the charge accumulation region that accumulates charges that have been subjected to photoelectric conversion by the photoelectric conversion elements 20a and 20b.

Subsequently, the read gate 24 and the sidewall 25 are formed at a predetermined position on the surface (here, the bottom surface) opposite to the subject light incident side surface of the P-type Si region 21 through a gate oxide film (not illustrated), and then the interlayer insulating film 23 is formed.

Subsequently, the multi-layer interconnection 26 buried in the interlayer insulating film 23 is formed. For example, the multi-layer interconnection 26 is formed by repeatedly performing a process of forming the interlayer insulating film 23 such as a SiO film, a process of forming a predetermined interconnection pattern in the interlayer insulating film 23, and a process of burying copper (Cu) or the like in the interconnection pattern and forming an interconnection.

Thereafter, the interlayer insulating film 23 bonds with the support substrate 27, and in a state in which the semiconductor substrate is supported by the support substrate 27, the semiconductor substrate is polished, and thus the surface (here, the top surface) of the P-type Si region 21 on which the subject light is incident is exposed.

Subsequently, the SiN film 28 serving as the anti-reflection film is formed on the top surface of the P-type Si region 21, and the TEOS oxide film 29 which is to be used as a hard mask later is formed on the top surface of the SiN film 28. For example, the SiN film 28 and the TEOS oxide film 29 are formed by chemical vapor deposition (CVD).

Thereafter, the top surface of the TEOS oxide film 29 is coated with a resist 51, and the resist 51, at the forming position of the element isolation region 40 (see FIG. 2A) of isolating the photoelectric conversion elements 20a and 20b from each other, is selectively removed by the photolithography. As a result, a structure illustrated in FIG. 3A is formed.

Figure 3B:
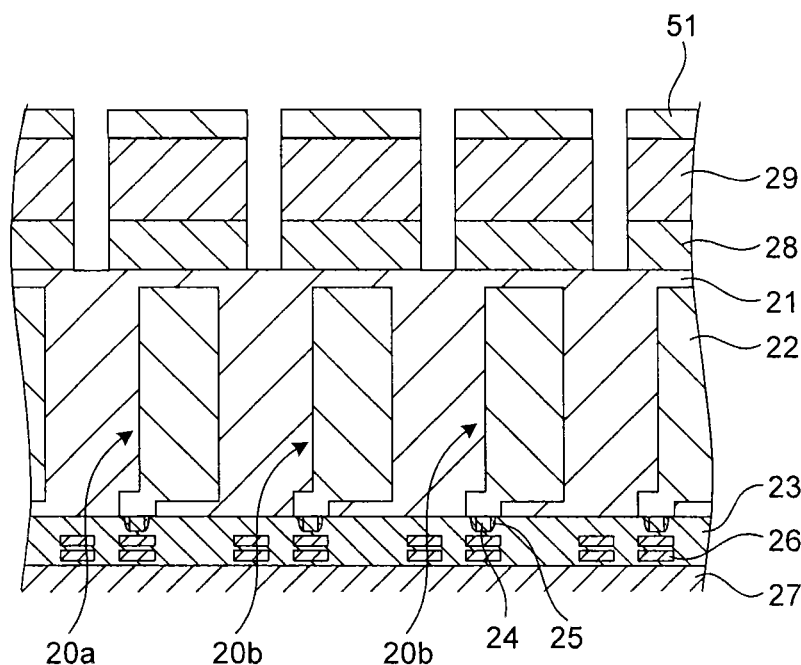

Subsequently, anisotropic etching is performed using the resist 51 as a soft mask, and so the TEOS oxide film 29 and the SiN film 28, at the forming position of the element isolation region 40 of isolating the photoelectric conversion elements 20a and 20b from each other, are removed as illustrated in FIG. 3B.

Figure 4A:
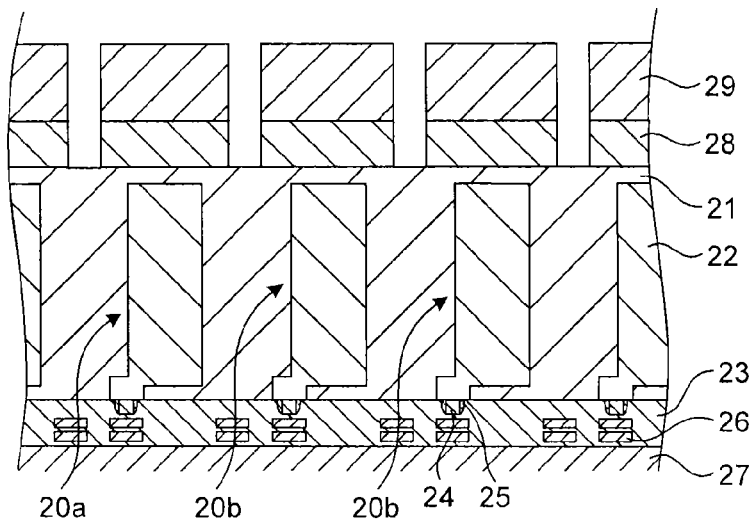
FIGS. 4A to 4C are explanatory cross-sectional views illustrating a manufacturing process of a CMOS sensor according to an embodiment.
Figure 4B:
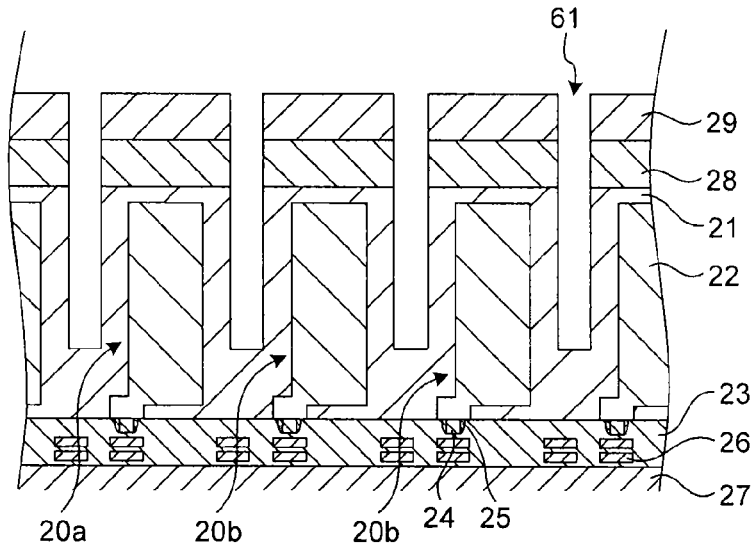

Thereafter, as illustrated in FIG. 4A, the resist 51 is peeled off, and then anisotropic etching is performed using the TEOS oxide film 29 as a hard mask. As a result, a trench 61 is formed at the position to isolate the photoelectric conversion elements 20a and 20b from each other as illustrated in FIG. 4B.

Figure 4C:
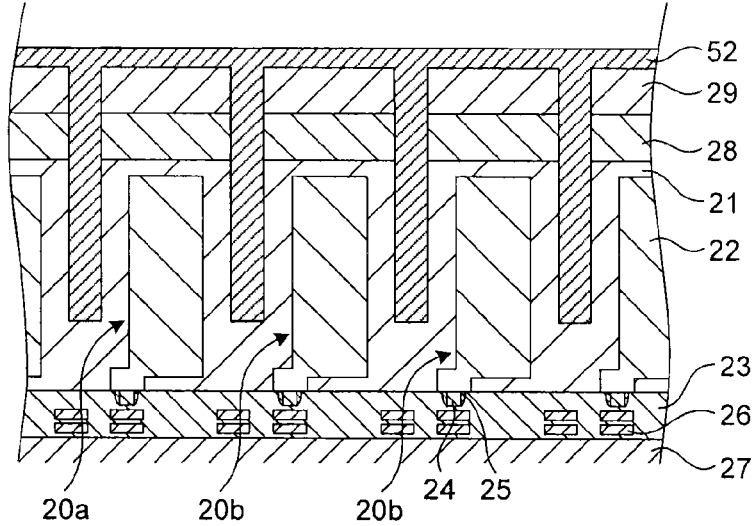

At this time, the top surface of the TEOS oxide film 29 is etched, and the thickness thereof is reduced. Subsequently, as illustrated in FIG. 4C, for example, the trench 61 is back-filled with an organic member 52 such as resin, and the top surface of the TEOS oxide film 29 is coated with the organic member 52.

Figure 5A:
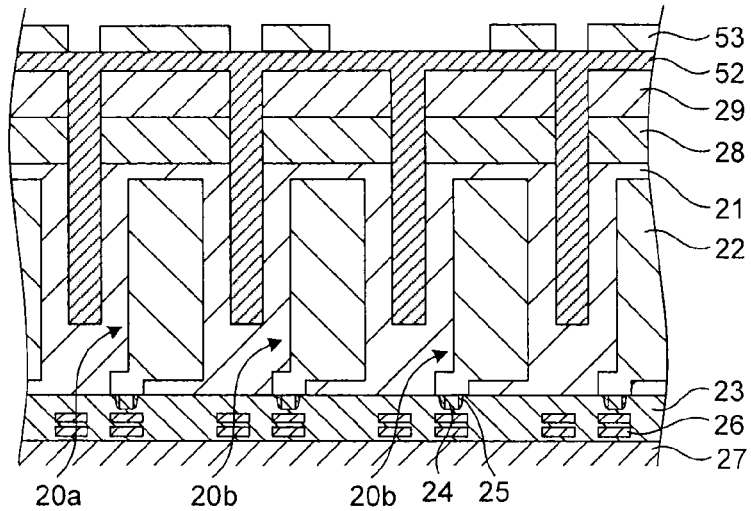
FIGS. 5A to 5C are explanatory cross-sectional views illustrating a manufacturing process of a CMOS sensor according to an embodiment.

Thereafter, the top surface of the organic member 52 is coated with a resist 53. Then, as illustrated in FIG. 5A, the resist 53, at the forming position of the light shielding film 43 (see FIG. 2A) formed on the light receiving surface (the top surface of the P-type Si region 21) side of the adjustment photoelectric conversion element 20b, is removed by the photolithography. At this time, the resist 53 at the forming position of the trench 61 (see FIG. 4B) is also removed by the photolithography.

Figure 5B:
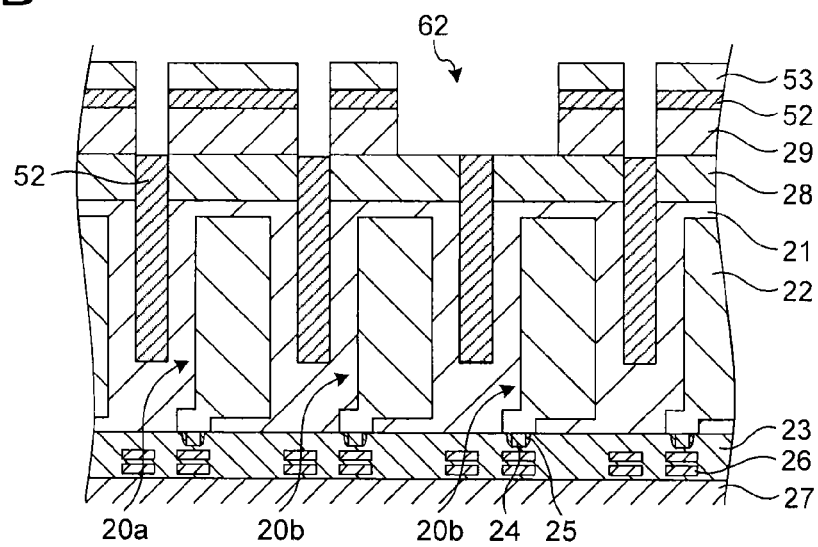

Subsequently, as illustrated in FIG. 5B, anisotropic etching is performed using the resist 53 as a soft mask, and so a concave portion 62 is formed at the position at which the light shielding film 43 (see FIG. 2A) is to be formed.

Specifically, the concave portion 62 having an aperture plane that overlaps at least part of the light receiving surface of the adjustment photoelectric conversion element 20b is formed on the light receiving surface side of the adjustment photoelectric conversion element 20b. At this time, the concave portion 62 is formed at the position at which the aperture plane is one-sided in a predetermined direction with respect to the light receiving surface of the adjustment photoelectric conversion element 20b (see FIG. 2B).

As described above, the concave portion 62 is formed at the position at which the aperture plane is one-sided in a predetermined direction with respect to the light receiving surface of the photoelectric conversion element 20b, and then the light shielding member 41 is buried in the concave portion 62, and thus the photoelectric conversion element 20b for a focus adjustment by the phase difference detection scheme can be performed.

Here, the concave portion 62 is formed through etching such that the bottom surface of the concave portion 62 is positioned on the subject light incident side rather than the light receiving surface of the adjustment photoelectric conversion element 20b. As a result, it is possible to prevent the adjustment photoelectric conversion element 20b from being partially removed through etching. At this time, the organic member 52 at the forming position of the trench 61 (see FIG. 4B) is also removed through etching.

Figure 5C:
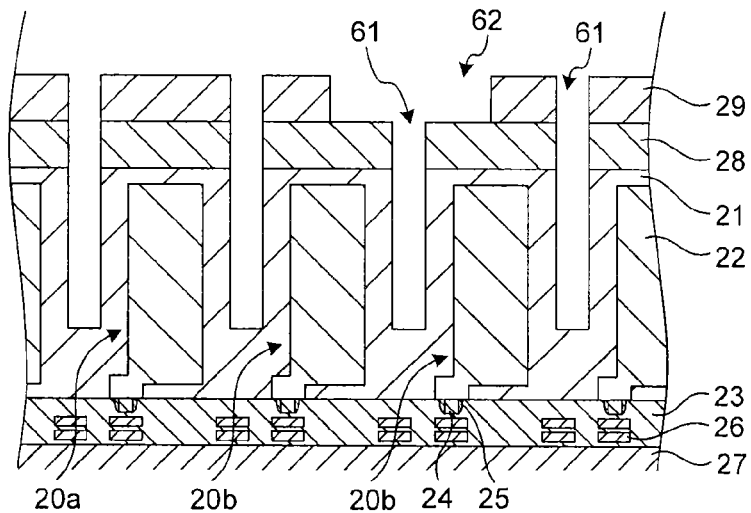

Thereafter, asking is performed on the resist 53 and the organic member 52, and thus the resist 53 is removed from the top surface of the organic member 52, and the organic member 52 is removed from the top surface of the TEOS oxide film 29 and the inside of the trench 61 as illustrated in FIG. 5C.

Figure 6A:
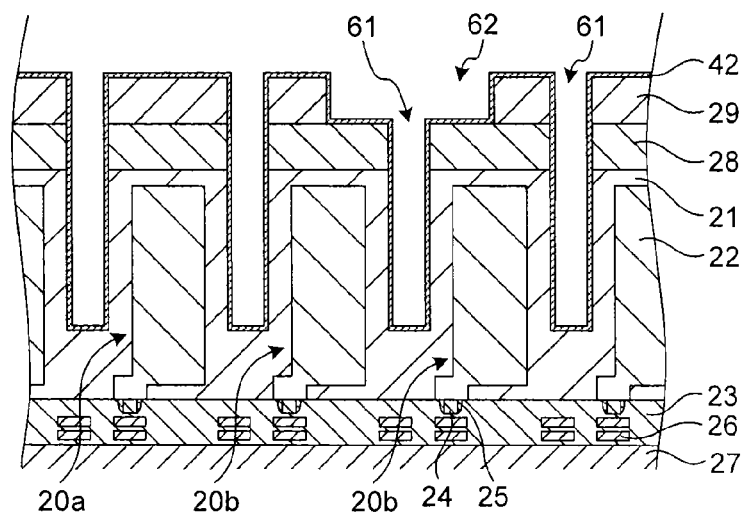
FIGS. 6A to 6C are explanatory cross-sectional views illustrating a manufacturing process of a CMOS sensor according to an embodiment.

Subsequently, the inner circumferential surfaces of the trench 61 and the concave portion 62 are coated with the insulating film 42 as illustrated in FIG. 6A. Here, for example, the formed insulating film 42 is a SiO film that formed on the inner circumferential surfaces of the trench 61 and the concave portion 62 through atomic layer deposition (ALD).

Figure 6B:
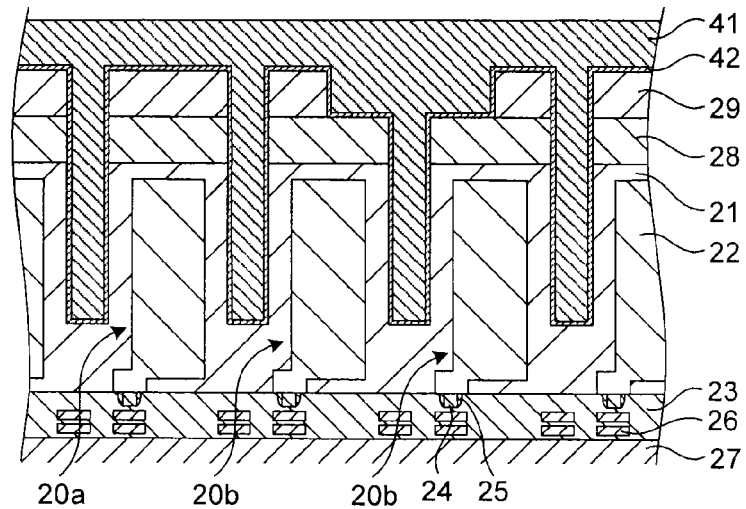

Thereafter, the light shielding member 41 is buried inside the trench 61 and the concave portion 62 whose inner circumferential surfaces are coated with the insulating film 42 as illustrated in FIG. 6B. Here, for example, the buried light shielding member 41 is metal having a light shielding characteristic such as aluminum (Al), tungsten (W), and copper (Cu). For example, the metal having the light shielding characteristic is buried inside the trench 61 and the concave portion 62 using a sputtering technique or an electrolytic plating technique.

Figure 6C:
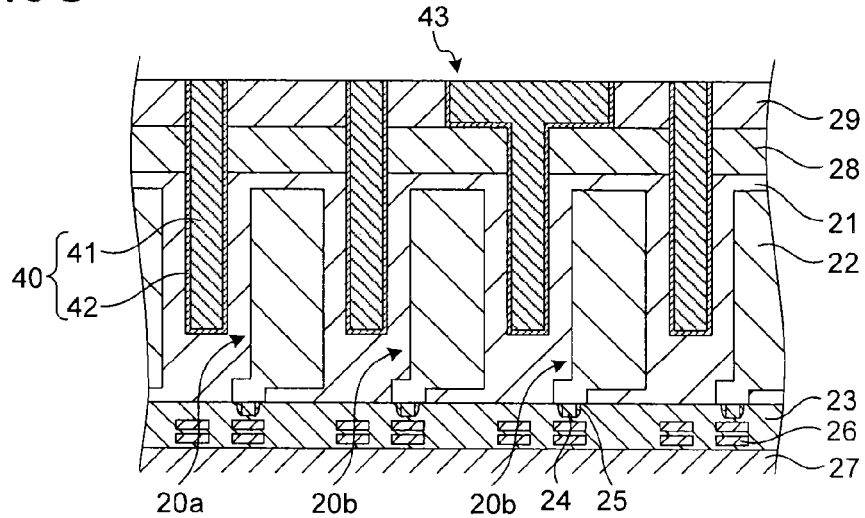

Subsequently, an unnecessary portion of the light shielding member 41 is removed through wet etching, dry etching, or chemical mechanical polishing (CMP), and the top surface of the TEOS oxide film 29 is exposed as illustrated in FIG. 6C. Thus, in the method of manufacturing the CMOS sensor 1 according to an embodiment, the element isolation region 40 and the light shielding film 43 can be simultaneously formed by dual-damascene.

Finally, the color filters R, G, and B and the microlens L are sequentially formed, at a predetermined position, on the top surface of the structure formed as described above, so that the CMOS sensor 1 including the pixel unit 2 illustrated in FIG. 2A is manufactured.

As described above, according to the present embodiment, by performing the photolithography twice in the process illustrated in FIG. 3A and the process illustrated in FIG. 5A, the trench 61 can be formed at the forming position of the element isolation region 40, and the concave portion 62 can be performed at the forming position of the light shielding film 43.

Further, in the present embodiment, the inner circumferential surfaces of the trench 61 and the concave portion 62 formed as described above are coated with the insulating film 42, and the light shielding member 41 is buried inside the trench 61 and the concave portion 62, and thus the element isolation region 40 and the light shielding film 43 can be simultaneously formed. According to the present embodiment, since the element isolation region 40 and the light shielding film 43 are simultaneously formed by dual-damascene, and thus the manufacturing process of forming the element isolation region 40 and the light shielding film 43 can be simplified.

Further, the CMOS sensor 1 and the manufacturing method of the CMOS sensor 1 are exemplary, and various modifications can be made. A method of manufacturing a CMOS sensor according to a modification will be described below with reference to FIGS. 7A and 7B.

Figure 7A:
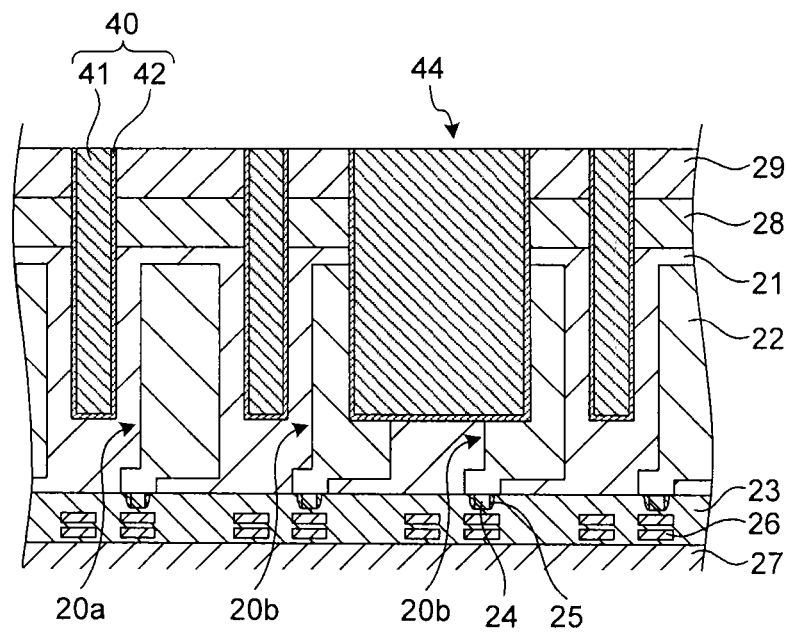
FIGS. 7A and 7B are explanatory views illustrating a method of manufacturing a CMOS sensor according to a modification of the embodiment.
Figure 7B:
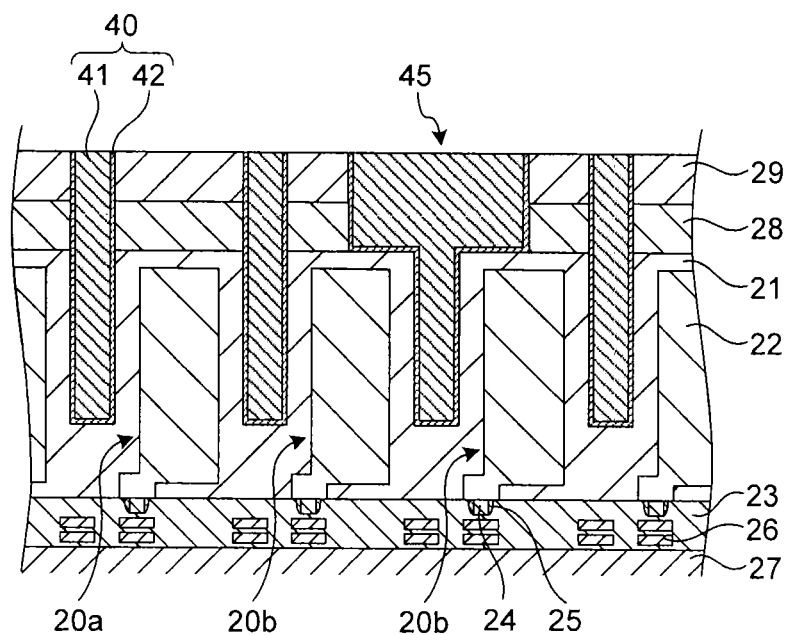

FIGS. 7A and 7B are explanatory views illustrating a method of manufacturing a CMOS sensor according to a modification of the embodiment. Here, FIG. 7A illustrates a manufacturing process of a CMOS sensor according to a first modification, and FIG. 7B illustrates a manufacturing process of a CMOS sensor according to a second modification.

FIGS. 7A and 7B illustrate a state before the color filters R, G, and B and the microlens L are formed. In the following, among components illustrated in FIGS. 7A and 7B, the same components or components having the same functions as the components illustrated in FIGS. 2A to 6C are denoted by the same reference numerals as in FIGS. 2A to 6C, and thus a description thereof will not be made.

As illustrated in FIG. 7A, when the CMOS sensor according to the first modification is manufactured, a process of forming the trench 61 and a process of forming the concave portion 62 are simultaneously executed. At this time, the concave portion 62 is formed at the same depth as the trench 61.

Specifically, in the manufacturing method according to the first modification, after the TEOS oxide film 29 is formed, the resist 51 in which the forming position of the element isolation region 40 and the forming position of the light shielding film 43 are selectively removed is formed on the top surface of the TEOS oxide film 29. Then, anisotropic etching is performed using the resist 51 as a mask.

As a result, the trench 61 is formed at the forming position of the element isolation region 40, and at the same time, the concave portion 62 having the same depth as the trench 61 is formed at the forming position of the light shielding film 43. Subsequently, the inner circumferential surfaces of the trench 61 and the concave portion 62 formed at the same depth are coated with the insulating film 42, and then the light shielding member 41 is buried inside the trench 61 and the concave portion 62, and thus the element isolation region 40 and the light shielding film 44 are formed at the same time.

According to this manufacturing method, the photolithography necessary to form the element isolation region 40 and the light shielding film 44 is performed only once when the resist 51 to be formed on the top surface of the TEOS oxide film 29 is patterned. Thus, according to the manufacturing method according to the first modification, the manufacturing process of forming the element isolation region 40 and the light shielding film 44 can be simplified.

Next, as illustrated in FIG. 7B, in the manufacturing method according to the second modification, a light shielding film 45 is formed such that the bottom surface of the light shielding film 45 is close to the light receiving surface (the top surface) of the adjustment photoelectric conversion element 20b with the insulating film 42 interposed therebetween.

For example, when the light shielding film 45 is formed, in the process illustrated in FIG. 5B, anisotropic etching is performed until the bottom surface of the concave portion 62 reaches the bottom surface of the TEOS oxide film 29. Subsequently, the organic member 52 in the trench 61 is removed by ashing, then the inner circumferential surfaces of the trench 61 and the concave portion 62 are coated with the insulating film 42, and thereafter, the light shielding member 41 is buried inside the trench 61 and the concave portion 62. As a result, the element isolation region 40 and the light shielding film 45 illustrated in FIG. 7B are formed at the same time.

According to this manufacturing method, the light shielding film 45 can be formed directly on the light receiving surface of the adjustment photoelectric conversion element 20b, and thus the light shielding film 45 in which a light shielding characteristic on the adjustment photoelectric conversion element 20b is improved can be formed.

In addition, the above-described embodiment has been described in connection with the example in which the adjustment photoelectric conversion element 20b is used for a focus adjustment of an imaging lens by the phase difference detection scheme, but may be configured to be used for an optical black.

For example, the light shielding region by the light shielding film 43, 44, or 45 formed on the light receiving surface side of the adjustment photoelectric conversion element 20b can be extended to the whole light receiving surface of the photoelectric conversion element 20b, and thus the adjustment photoelectric conversion element 20b can be used for an optical black.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a solid-state imaging device, comprising:
    forming a trench at a position to isolate a plurality of photoelectric conversion elements including an imaging photoelectric conversion element used for imaging of an image and an adjustment photoelectric conversion element used for an image quality adjustment of an imaged image;
    forming a concave portion at a position to form a light shielding film that shields at least part of subject light incident to the adjustment photoelectric conversion element;
    coating inner circumferential surfaces of the trench and the concave portion with an insulating film; and
    burying a light shielding member inside the trench and the concave portion whose inner circumferential surfaces are coated with the insulating film;
    wherein the concave portion is formed such that an aperture plane is one-sided in a predetermined direction with respect to the light receiving surface of the adjustment photoelectric conversion element used for a focus adjustment by a phase difference detection scheme; and
    wherein the concave portion is formed at a position to form a light shielding film that shields diagonal half of the light receiving surface of the adjustment photoelectric conversion element.

2. The method according to claim 1, wherein the concave portion is formed such that a bottom surface of the concave portion is positioned at a subject light incident side rather than a light receiving surface in the adjustment photoelectric conversion element.

3. The method according to claim 1, wherein the trench and the concave portion are simultaneously formed and have the same depth.

4. The method according to claim 1, wherein the insulating film is formed using an ALD (Atomic Layer Deposition) technique.

5. The method according to claim 1, wherein the light shielding member is made of any one of aluminum (Al), tungsten (W), and copper (Cu).

6. The method according to claim 1, wherein the concave portion is formed such that a bottom surface of the concave portion reaches a light receiving surface of the adjustment photoelectric conversion element.

7. The method according to claim 1, wherein the concave portion is formed at a position to form the light shielding film that shields the whole light receiving surface of the adjustment photoelectric conversion element used for an optical black.

8. The method according to claim 1, wherein the solid-state imaging device is a back-illuminated image sensor.

* * * * *